United States Patent
Hu et al.

(10) Patent No.: US 8,022,482 B2
(45) Date of Patent: Sep. 20, 2011

(54) DEVICE CONFIGURATION OF ASYMMETRICAL DMOSFET WITH SCHOTTKY BARRIER SOURCE

(75) Inventors: Yongzhong Hu, Cupertino, CA (US); Sung-Shan Tai, San Jose, CA (US)

(73) Assignee: Alpha & Omega Semiconductor, Ltd, Sunnyvale, CA (US)

( * ) Notice: Subject to any disclaimer, the term of this patent is extended or adjusted under 35 U.S.C. 154(b) by 165 days.

(21) Appl. No.: 11/355,128

(22) Filed: Feb. 14, 2006

(65) Prior Publication Data

US 2007/0187751 A1 Aug. 16, 2007

(51) Int. Cl.
   - H01L 27/108 (2006.01)
   - H01L 29/94 (2006.01)
   - H01L 21/08 (2006.01)
   - H01L 27/088 (2006.01)
   - H01L 29/40 (2006.01)
   - H01L 23/12 (2006.01)
   - H01L 23/48 (2006.01)
   - H01L 23/52 (2006.01)
   - H01L 29/417 (2006.01)
   - H01L 29/45 (2006.01)
   - H01L 29/78 (2006.01)
   - H01L 29/812 (2006.01)

(52) U.S. Cl. ........ 257/384; 257/302; 257/382; 257/401; 257/485; 257/486; 257/754; 257/757; 257/768; 257/769; 257/770; 257/E29.118; 257/E29.145; 257/E29.256; 257/E29.257; 257/E26.262; 257/E29.263; 257/E29.318

(58) Field of Classification Search ............ 438/92; 257/475, 486, 328, 382, 383, 384, 385, 401, 257/485, E29.148, E29.145, 288, 365, 368, 257/754, 757, 768, 769, 770, 355, 356, 242, 257/263, 302, E27.096, E27.118, E29.626, 257/E29.256, E29.257, E29.263, E29.318

See application file for complete search history.

(56) References Cited

U.S. PATENT DOCUMENTS 4,675,713 A * 6/1987 Terry et al. .............. 257/329

(Continued)

OTHER PUBLICATIONS

Derrien, J. "Schottky barrier heights of TM silicides on Si and GaAs." Properties of Metal Silicides Ed. Karen Maex and Marc Van Rossum London: INSPEC, Institute of Engineering and Technology, 1995.).*

(Continued)

Primary Examiner — Phat Cao
Assistant Examiner — Diana C Vieira
(74) Attorney, Agent, or Firm — Bo-In Lin (57) ABSTRACT

A trenched semiconductor power device includes a trenched gate insulated by a gate insulation layer and surrounded by a source region encompassed in a body region above a drain region disposed on a bottom surface of a semiconductor substrate. The source region surrounding the trenched gate includes a metal of low barrier height to function as a Schottky source. The metal of low barrier height further may include a PtSi or ErSi layer. In a preferred embodiment, the metal of low barrier height further includes an ErSi layer. The metal of low barrier height further may be a metal silicide layer having the low barrier height. A top oxide layer is disposed under a silicon nitride spacer on top of the trenched gate for insulating the trenched gate from the source region. A source contact disposed in a trench opened into the body region for contacting a body-contact dopant region and covering with a conductive metal layer such as a Ti/TiN layer. In a preferred embodiment, the semiconductor power device constitutes an asymmetrical double diffusion metal oxide semiconductor field effect transistor (DMOSFET) device.

13 Claims, 8 Drawing Sheets

U.S. PATENT DOCUMENTS

| | | | |
|---|---|---|---|
| 4,983,535 A * | 1/1991 | Blanchard | 438/270 |
| 6,621,107 B2 * | 9/2003 | Blanchard et al. | 257/155 |
| 7,081,388 B2 * | 7/2006 | Jones | 438/270 |
| 7,166,891 B2 * | 1/2007 | Yoshimochi | 257/329 |
| 7,214,576 B1 * | 5/2007 | Kaneko et al. | 438/197 |
| 7,504,690 B2 * | 3/2009 | Kelly et al. | 257/328 |
| 2002/0115257 A1 * | 8/2002 | Inagawa et al. | 438/270 |
| 2003/0001215 A1 * | 1/2003 | Wahl et al. | 257/401 |
| 2003/0060013 A1 * | 3/2003 | Marchant et al. | 438/270 |
| 2004/0021174 A1 * | 2/2004 | Kobayashi | 257/330 |
| 2006/0273380 A1 * | 12/2006 | Hshieh | 257/330 |
| 2006/0273384 A1 * | 12/2006 | Hshieh | 257/330 |
| 2007/0075362 A1 * | 4/2007 | Wu | 257/335 |

OTHER PUBLICATIONS

J.M. Larson and J.P. Snyder, "Overview and status of metal S/D Schottky-barrier MOSFET technology," IEEE Trans. Electron Devices, vol. 53, No. 5, pp. 1048-1058, May 2006.).*

Zhenjia, Xu. "Schottky barrier heights of RE silicides on Si." Properties of Metal Silicides Ed. Karen Maex and Marc Van Rossum London: INSPEC, Institute of Engineering and Technology, 1995.).*

* cited by examiner

DEVICE CONFIGURATION OF ASYMMETRICAL DMOSFET WITH SCHOTTKY BARRIER SOURCE

BACKGROUND OF THE INVENTION

1. Field of the Invention

The invention relates generally to the semiconductor power devices. More particularly, this invention relates to an improved and novel device manufacturing process to provide asymmetrical double diffusion metal oxide semiconductor field effect transistor (DMOSFET) with Schottky barrier source implemented with low-barrier height rare earth metal silicide for a best drive current without subject to a limitation of the high temperature processes and meanwhile providing low contact resistance of source and body contacts, which is achieved through silicided contact on the entire mesa area totally insulated from the trenched gates covered under an insulated spacer.

2. Description of the Prior Art

It is known in the semiconductor power industry to implement a Schottky barrier source or metal silicide source electrode to overcome the parasitic bipolar conduction in a DMOSFET device. In order to prevent an unclamped inductor switching (UIS) in the semiconductor power device, it is necessary to reduce the parasitic bipolar conduction. With the implementation of Schottky barrier source the theoretical emitter efficiency at the source is reduced by orders of magnitude compared to the conventional silicon source junction structures. Such configuration can significantly eliminate the parasitic bipolar gain of the device. However, conventional manufacturing processes are still limited by the use of metals of high barrier height. The devices as now available to those of ordinary skill in the art therefore suffers low drive current and subject to potential increased body bias and reducing the gate drive or even forward bias the body-source junction and initiate a snapback.

Figure 1A:
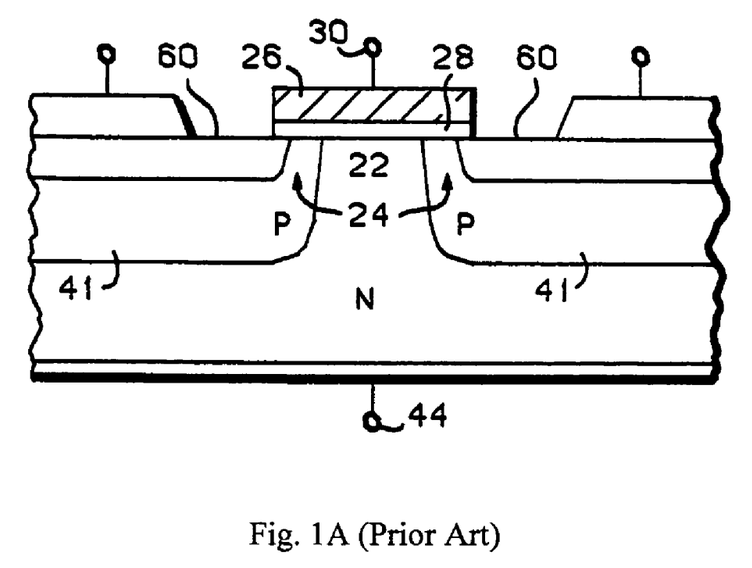
FIG. 1A is a cross sectional view of a conventional trenched MOSFET device implemented with a source contact by applying a metal with low barrier height.
Figure 1B:
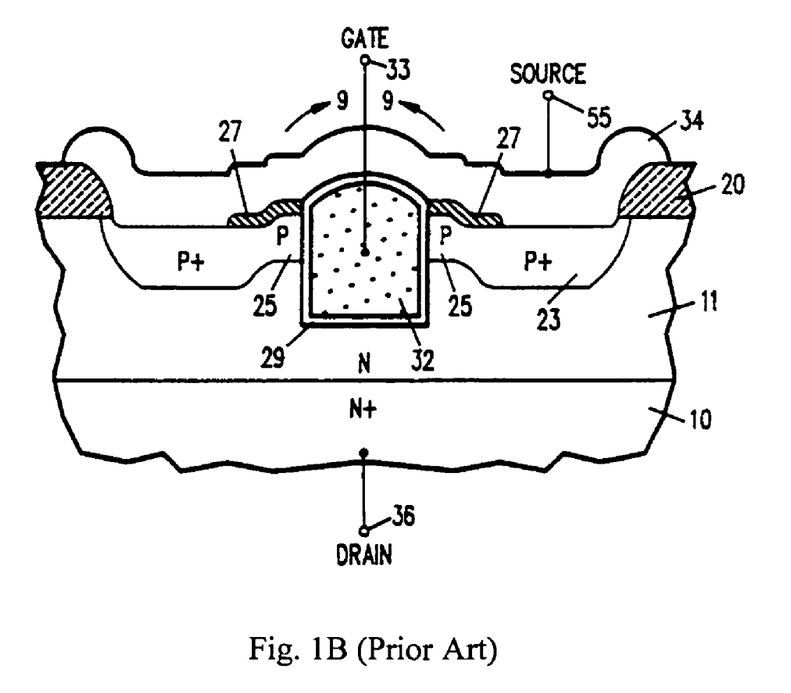
FIG. 1B shows another conventional semiconductor power device

U.S. Pat. No. 4,675,713 discloses a method of using the source Schottky junction as the body contact for a semiconductor power device as shown in FIG. 1A. In FIG. 1A, the diffused channel of the MOS transistor is of the type in which contact to the drain region 22 is made from the back side of the semiconductor device. Channel regions 24 are formed by diffusing P type body regions 41 into selected portions of the surface of an N type wafer. Source regions are then formed by diffusing a heavily doped N+ region into the P type body region to form a rectifying N+P junction. Specifically, the source regions 60 of the device are formed, not by diffused N type regions, but by a low minority carrier injecting metal having a low barrier height with respect to the P type channel region. Channel region 24 is the surface portion of body region 41 located between source and drain and controlled by potential on gate electrode 26 connected to a gate electrode 30 and padded with an gate oxide layer 28 underneath. The patented disclosure uses a low minority carrier injecting source region. A metal silicide layer is, implemented to form the low minority carrier injection source region. The metal silicide source provides a source of majority carriers and meanwhile reducing the minority carrier injection and hence reducing the parasitic bipolar transistor action. However, the higher barrier height of the source contact can potentially increase the body bias and reduce the gate drive, or even increase the forward bias of the body-source junction and initiate a snapback U.S. Pat. No. 4,983,535 discloses a fabrication method to manufacture a DMOS device shown in FIG. 1B. An N+ type silicon wafer 10 supports an N type epitaxial layer 11 thereon. A masking oxide 20 is either grown or deposited on top of the epitaxial layer. A photolithographic mask is used to create a hole in oxide 20. The resist is then removed and a heavily doped P+ region 23 is diffused into epitaxial layer 11. A second P-type diffusion creates the body region 25. A metal layer 27 is deposited on the silicon surface. This metal is a refractory metal such as tungsten applied by a selective deposition process. The metal is selected to form a suitable Schottky barrier with the silicon. As such it serves as a source of electrons for the DMOS device. Then using refractory metal layer 27 as an etch mask, the remnant of oxide 26 is removed and a trench (or groove) etched into the silicon to define the DMOS transistor gate. The wafer is then subjected to thermal oxidation and a gate oxide 29 is grown on the exposed silicon. A layer of polysilicon 32 is deposited over the wafer. This layer is doped to render it conductive either during or after deposition. Polysilicon 32 is then etched so as to remove it except for that portion inside the trench. Then the exposed surface of polysilicon 32 is oxidized so that it forms an insulating layer over the conductive plug facing oxide layer 29. Thus, the remaining plug of polysilicon forms the insulated DMOS gate electrode. A connection thereto is shown schematically at 33. A conventional metallization layer 34 is applied over the wafer and etched back. This makes an electrode contact to refractory metal layer 27 and to deep P+ regions 23 and thereby forms source contact 55 which is shown schematically. N+ wafer 10 forms the DMOS drain contact shown schematically at 36. The method includes the processing steps use a starting material of a heavily doped silicon wafer, which has an epitaxial layer thereon. A DMOS body region is diffused into the epitaxial layer and a deep body contact region created. The source is a refractory metal Schottky barrier located on top of the body region. A trench is etched into the epitaxial layer so as to fully penetrate the body region and the trench surfaces oxidized to form a gate oxide. The trench is then filled with doped polysilicon to create a gate electrode. The resulting DMOS has a relatively short channel and the parallel bipolar parasitic transistor cannot be turned on. Since the method forms the Schottky barrier source prior to the trench and gate formation, therefore only refractory metal with high barrier height can be used. For this reasons, the device suffers a low drive current.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with a process of forming the trench and recessed poly gate, and furnishing the body contact implant and activation prior to the metal Schottky barrier formation. Therefore, all the high-temperature processing steps are done before the metal source silicidation. The new and improved manufacturing process enables the employment of low-barrier height rare earth metal silicide for the best drive current. The above-discussed difficulties as confronted by the conventional technologies are therefore resolved.

Furthermore, this invention discloses a trench contact is formulated through mask and etching of the Schottky metal silicide at body contact region. This process provides a direct ohmic contact to the transistor body. Subsequent process steps eventually implement a metallization to contact the whole mesa region that includes the source and body contact. The metallization contact thus achieves a much-reduced contact resistance.

Briefly in a preferred embodiment this invention discloses a trenched semiconductor power device comprising a trenched gate insulated by a gate insulation layer and surrounded by a source region encompassed in a body region above a drain region disposed on a bottom surface of a semiconductor substrate. The semiconductor power device further includes a source/body contact trench opened into the body region having a body contact dopant region disposed below and around sidewalls of the source/body contact trench to electrically contact the source and body regions. The semiconductor power device further includes a source contact comprising a source contact conductive layer covering a bottom surface of the source/body contact trench contacting the body contact dopant region below the source/body contact trench wherein the source/body contact trench is further filled with a conductive material covering the conductive source contact layer. In a preferred embodiment, the semiconductor power device further includes a metal layer disposed under the insulation layer covering the source contact conductive layer for electrically contacting a top surface of the source region. In another preferred embodiment, the semiconductor power device further includes a silicide metal layer disposed under the insulation layer covering the source contact conductive layer for forming a salicided source conductive layer on the bottom surface of the source/body contact trench and the silicide metal layer further extending from the source/body contact trench for electrically contacting a top surface of the source region These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 3A to 3K are a serial of cross sectional views for showing the manufacturing processes of a DMOS device of this invention as shown in FIG. 2.

DETAILED DESCRIPTION OF THE METHOD

Figure 2:
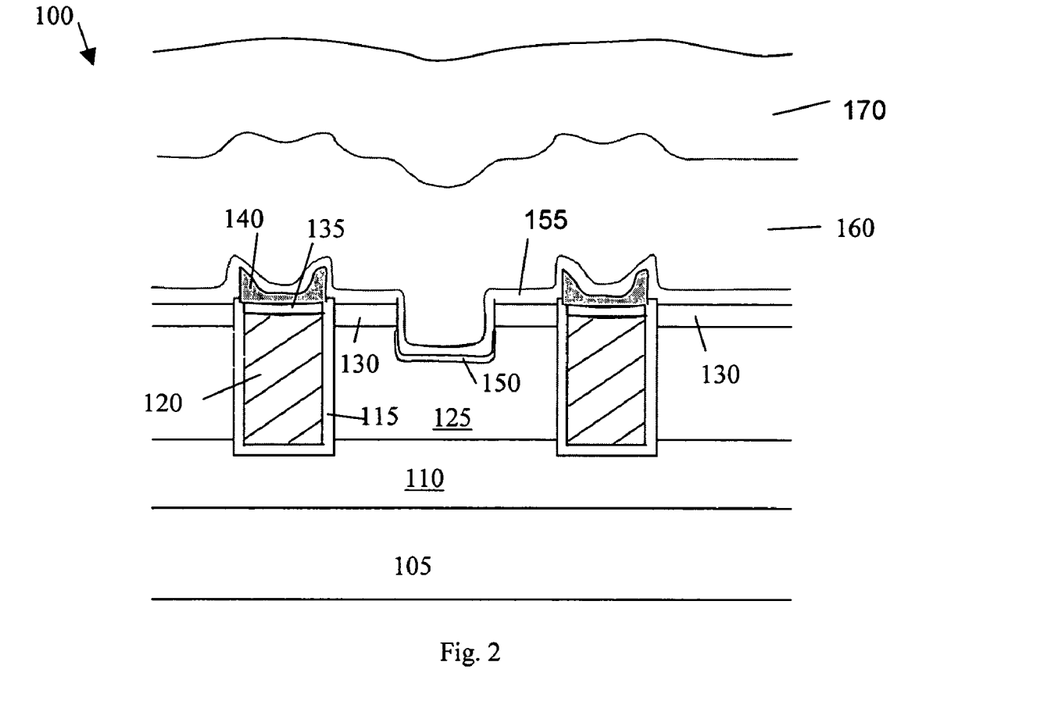
FIG. 2 is a cross sectional view of a trenched DMOS device as one exemplary embodiment of this invention.

Referring to FIG. 2 for a cross sectional view of a trenched DMOS device 100. The trenched DMOS device 100 is supported on a substrate formed with an epitaxial drift layer 110. The DMOS device further includes a plurality of trenches opened in the epitaxial drift region 110. The trenches are padded with a gate oxide layer 115 and filled with a gate material, e.g., polysilicon 120. A body region 125 doped with a body dopant, e.g., P-type body dopant, surrounding the trenched gates 120. Encompassed in the body regions 125 are source regions 130 near the top surface of the epitaxial drift region 110 surrounding the trenched gates 120. The source region 130 is formed with a low barrier height metal to function as a silicide Schottky source. The gates 120 is insulated further from the source region with a top insulation oxide layer 135 covered under an insulated spacer, e.g., silicon nitride spacers 140, covering over the top oxide layer 135.

The DMOS device 100 further includes a source contact trench opened in the body regions 125 above a body-contact dopant region 150. As will be further described below, the body-contact dopant regions 150 are implanted and activation prior to the formation of the metal Schottky barrier 130. The trenched contacts above the body contact dopant regions 150 are formed through mask to etch through the metal silicide at body contact region. This configuration provides direct ohmic contact to the transistor body to reduce the transistor body resistance.

A low resistance layer 155 such as a layer of Ti/TiN is formed to cover the source contact to further increase the contact area to the source and body regions. Additionally, the metallization of silicide layer 130 as the source region achieves a significantly reduced contact resistance. The DMOS device 100 further includes a metal contact layer 160 to function as a source metal and gate metal (not shown). An overlying passivation layer 170 further covers and protects the entire device.

Figure 3A:
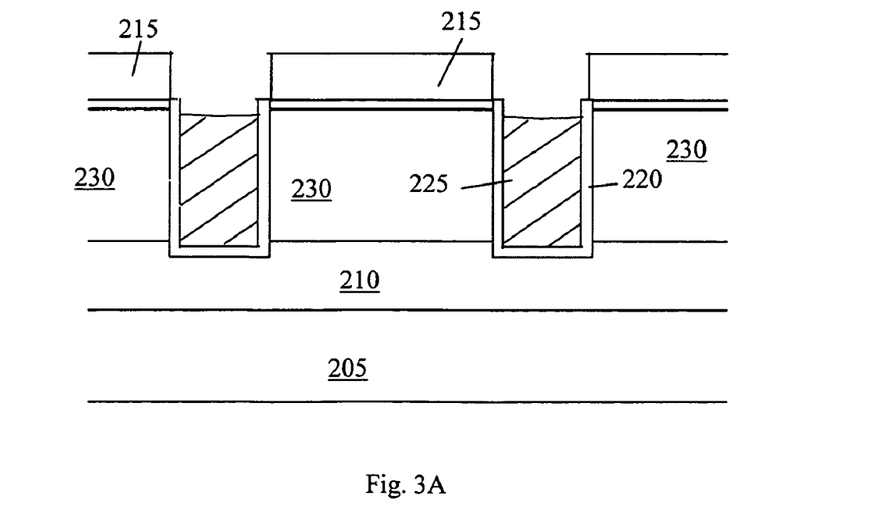

Referring to FIGS. 3A to 3K for a serial of side cross sectional views to illustrate the fabrication steps of a DMOSFET device as that shown in FIG. 2. In FIG. 3A, a pad oxidation is carried out to form a pad oxide layer and a hard mask layer 215 is deposited to function as a hard mask. A trench mask (not shown) is applied to etch a plurality of trenches through the hard mask layer 215 and the epitaxial drift layer 210 supported on a substrate 205. The trench is oxidized with a sacrificial oxide to remove the plasma damaged silicon layer during the process of opening the trench. An oxidation process is performed to form an oxide layer 220 covering the trench walls as the gate oxide for the transistors. Then a polysilicon layer 225 is deposited to fill the trench and covering the top surface and then doped with an N+ followed by applying a rapid thermal activation (RTA) process. Then the polysilicon layer is etched back as recessed trenched gate 225 surrounded by the hard mask layer 215. A body dopant implant and diffusion are performed to form the body regions 230.

Figure 3B:
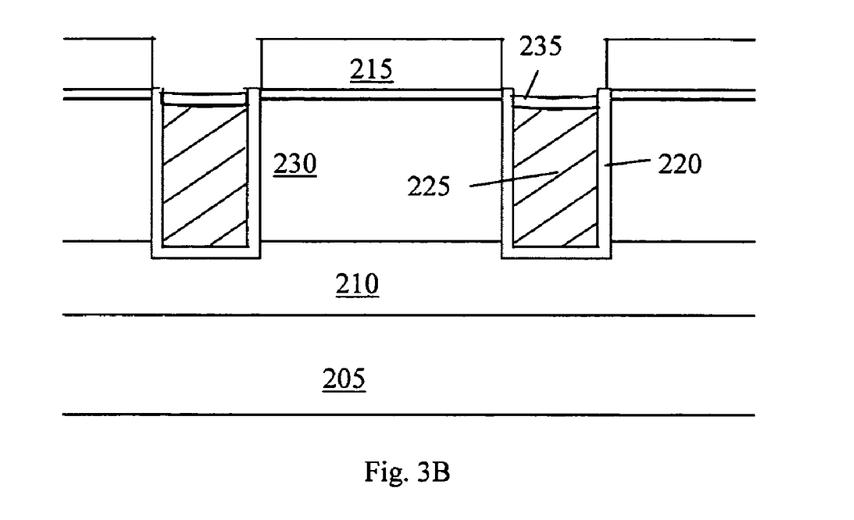
Figure 3C:
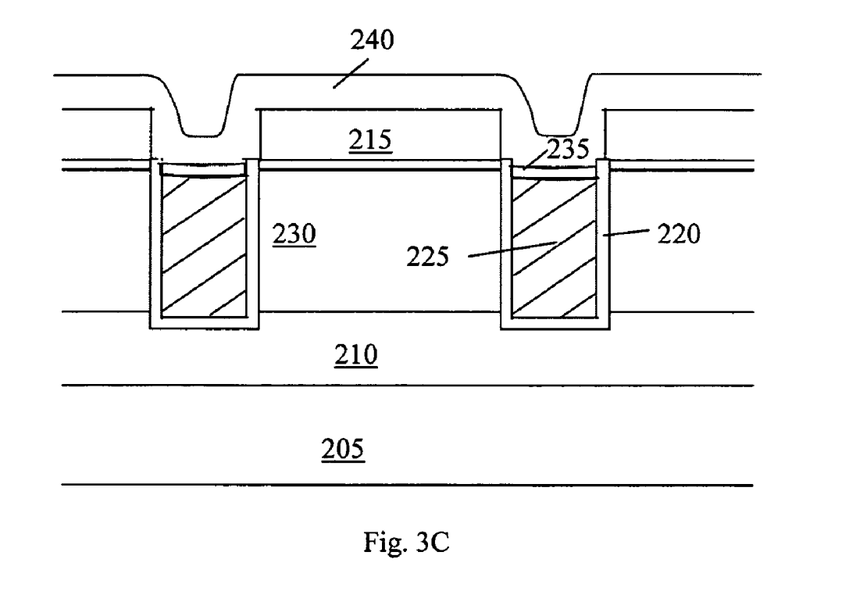
Figure 3D:
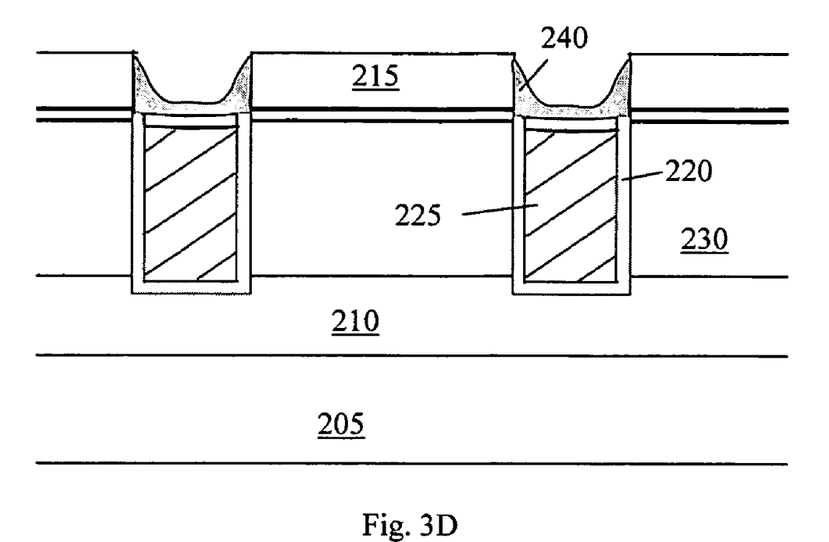
Figure 3E:
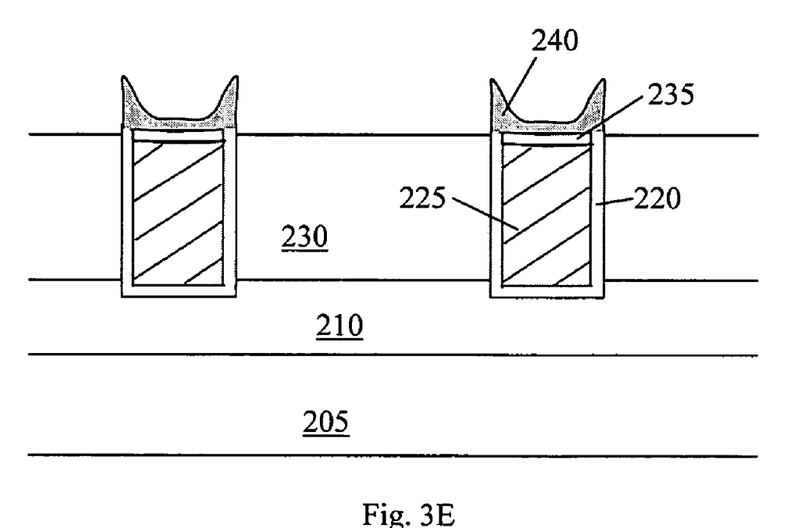

In FIG. 3B, a gate annealing and gate oxidation forms a self-aligned oxide layer 235 covering the polysilicon gate 225. In FIG. 3C, a silicon nitride spacer layer 240 is deposited on top. In FIG. 3D, either a photoresist (not shown) is applied or a spin-on-glass (SOG) is spanned on (not shown) and then blank etch back is done, removing the silicon nitride layer 240 from the top of the hard mask leaving the spacer 240 around the side walls of the hard mask 215. Then the remaining photoresist or the SOG is removed with a cleaning process. In FIG. 3E, a dry etch followed by a wet etch process are applied to remove the oxide hard mask 215 so that the mesa silicon surface is fully exposed. A blank isotropic silicon etch is performed on the silicon mesa surface. The polysilicon gate 225 recess in reference to the mesa silicon surface is reduced. The source and gate overlap issues that could happen during the source silicidation process as will be further discussed below are mitigated. Special cares are taken in the hard mask removal processes to assure sufficient gate oxide and polyoxide layer thickness at the gate mesa corners to prevent weakness between the source and the gate.

Figure 3F:
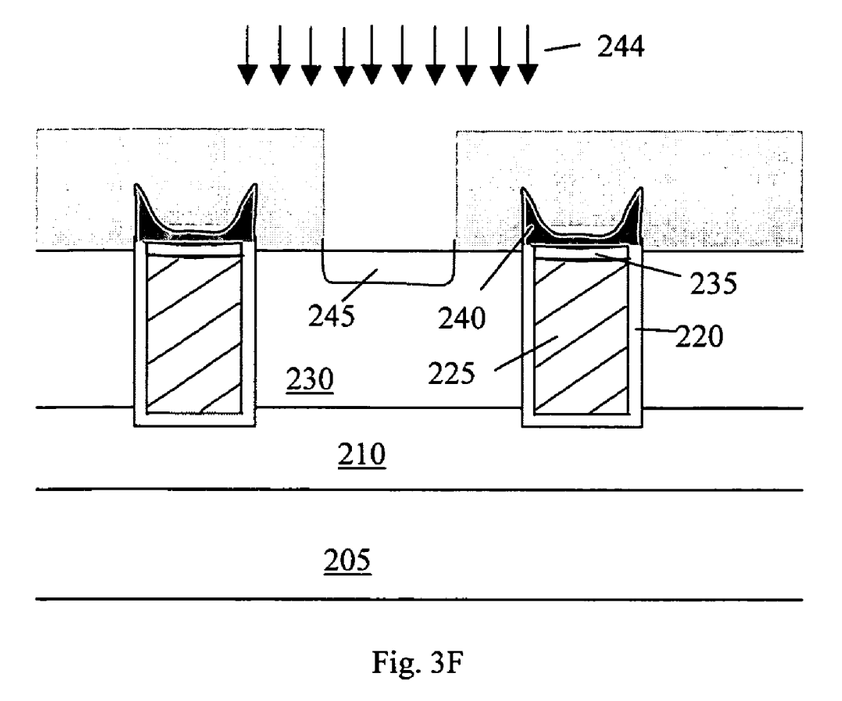
Figure 3G:
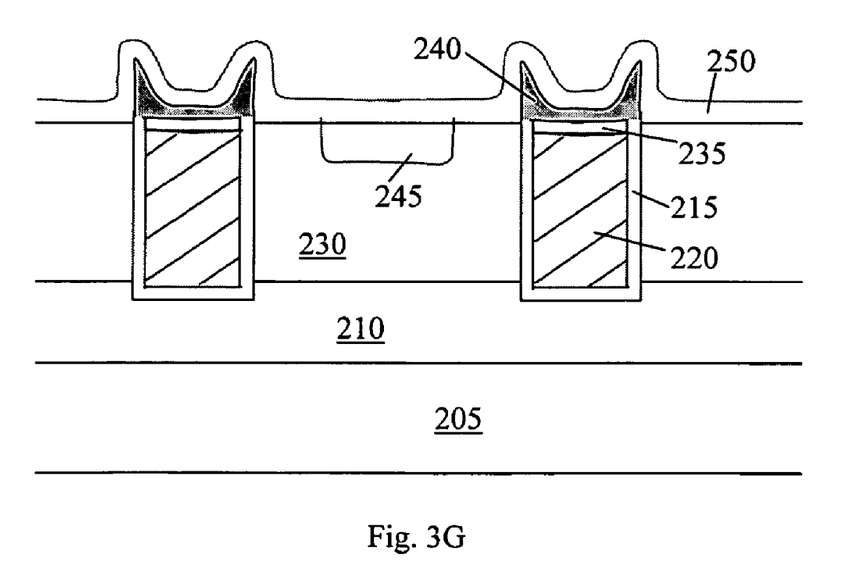
Figure 3H:
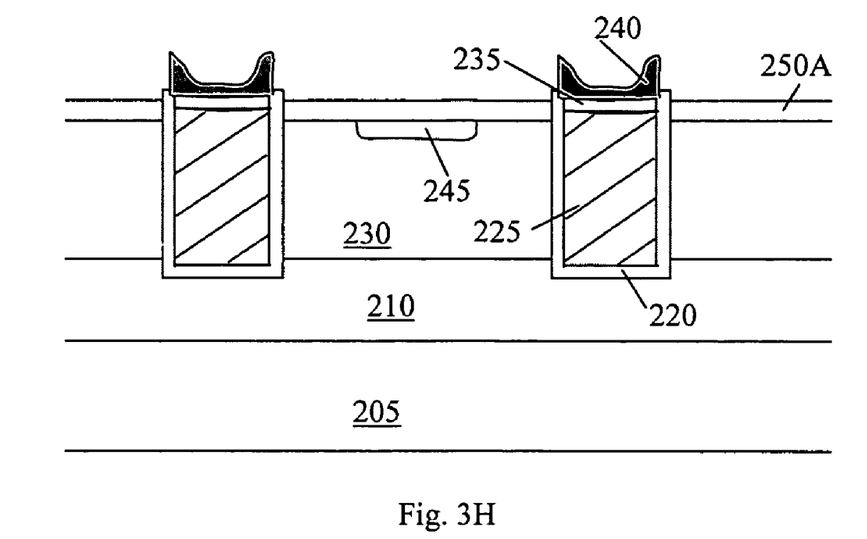

In FIG. 3F, a contact mask 242 is applied to implant contact dopant ions 244 to form body contact dopant region 245. In FIG. 3G, the contact mask 242 is removed and cleaned. A rapid thermal activation (RTA) for the contact dopant region 245 is carried out at a temperature around 900 to 950 C. Then, a platinum (FT) or other low barrier height rare earth metal layer 250 is deposited. The thickness of the metal layer 250 is carefully optimized to obtain a good source and gate overlap after the source silicidation. In FIG. 3H, silicidation process at low temperature of ~450 C that is well known in the art is carried out to form a low barrier height metal silicide layer, e.g., a PtSi layer 250A. The un-reacted platinum or other low barrier height metal is removed.

Figure 3I:
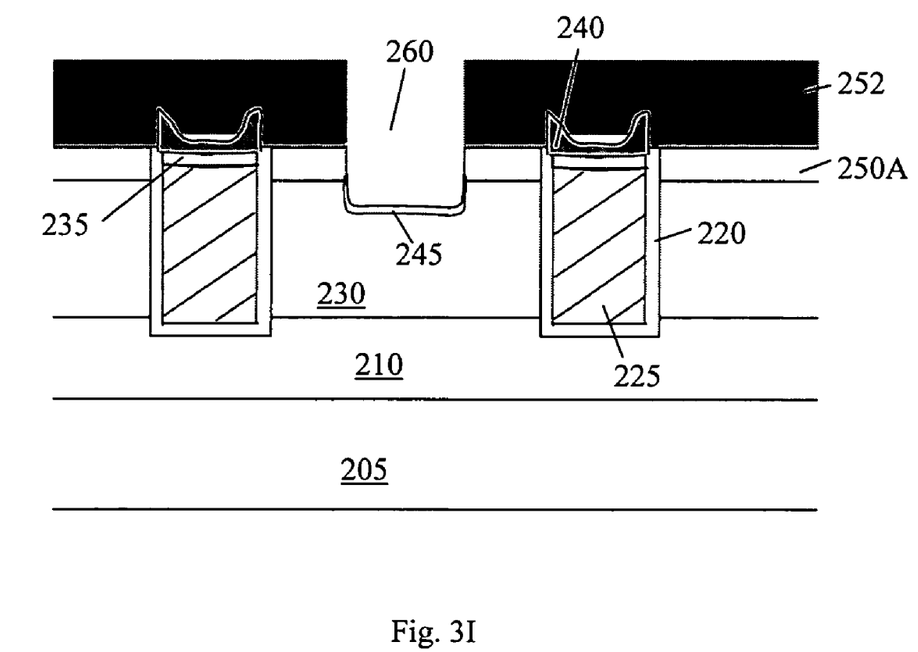
Figure 3J:
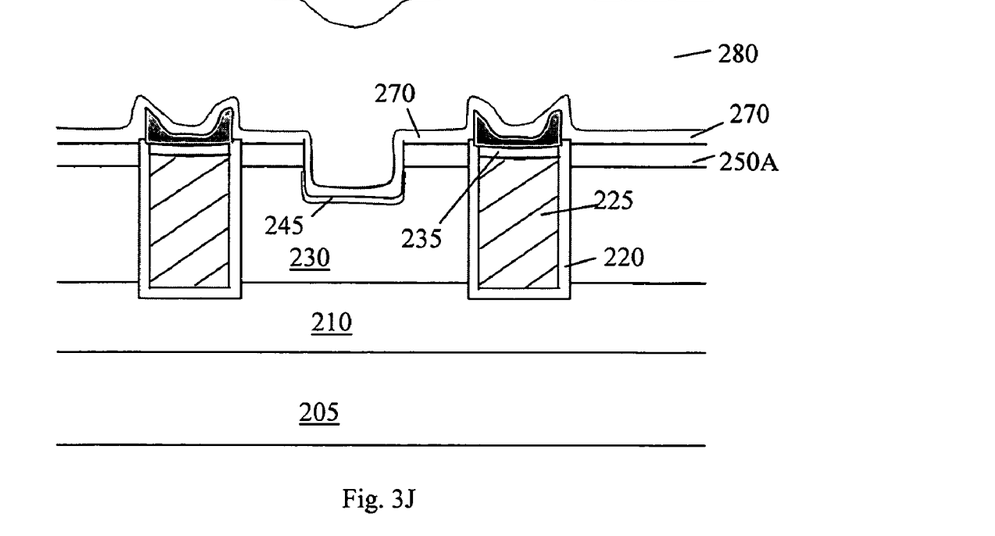
Figure 3K:
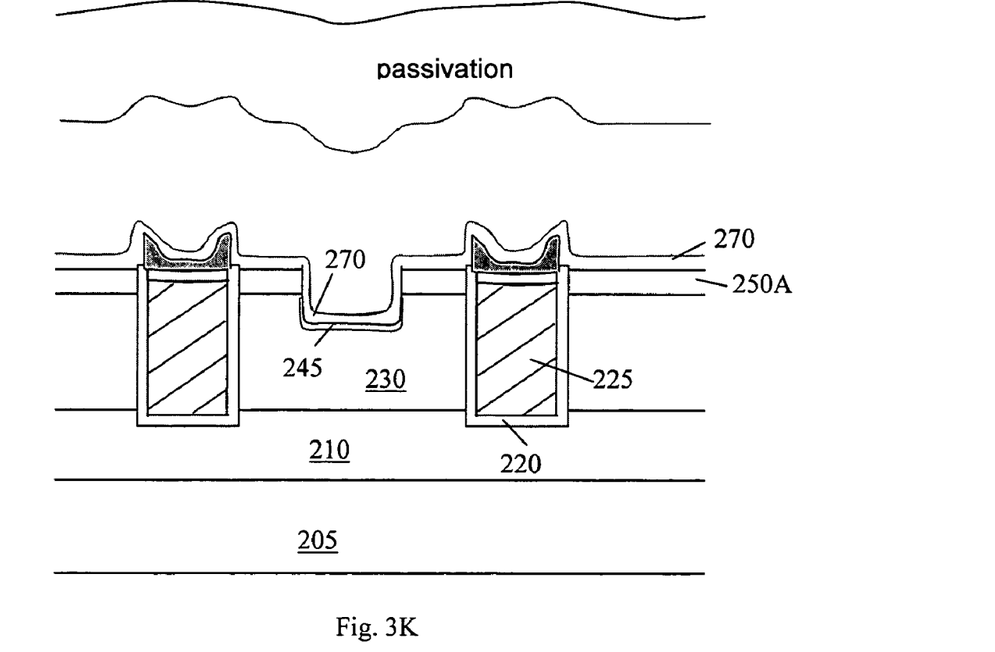

In FIG. 3I, a contact mask 252 is applied. A PtSi or other low barrier height metal silicide etch is carried out by applying an anisotropic etch with fluorine and chlorine gas mixture. The etch process can also be performed with a sputter etch with argon and oxygen gas mixture. Then a silicon etch is performed to open the contact opening 260 on top of the contact dopant region 245. Then a cleaning process is performed to remove the surface damages and clean the photoresist 252. In FIG. 3J, a low resistance Ti/TiN layer 270 is deposited on top followed by depositing a metal layer 280 on top. Then a metal mask is applied (not shown) to pattern the metal layer 270 into source metal and gate pad(s). In FIG. 3K, a passivation layer 290 is deposited on top to protect the device followed by applying a passivation mask (not shown) to pattern the passivation layer 290 to complete the manufacturing processes.

This DMOS device 100 and the manufacturing method overcome the disadvantages confronted by the conventional technologies. The processing steps of the DMOS device 100 provide the trenched and recessed polysilicon gate, and furnishing the body contact implant and activation prior to the metal Schottky barrier formation. Therefore, all the high-temperature processing steps are completed before the metal source silicidation. The processing steps and configuration enable the employment of low-barrier height rare earth metal silicide for the best drive current. In the meantime, a trench contact is formulated through mask and etching of the metal silicide at body contact region, to form an ohmic contact to the transistor body. Eventually, a metallization is done to contact the whole mesa region (source and body contact), achieving low contact resistances.

According to FIGS. 3A to 3K and above descriptions, this invention discloses a method for manufacturing a trenched semiconductor power device. The method includes a step of employing a low barrier-height rare earth metal for performing a metal source silicidation to form a source region surrounding a trenched gate of the semiconductor power device wherein the low barrier-height rare earth metal silicide having a barrier height in an approximate range of 0.20 to 0.35 eV to function as a Schottky source. In a preferred embodiment, the method further includes a step of completing a plurality of high temperature processing steps before the step of metal source silicidation for enabling an employment of the low barrier-height rare earth metal. In another preferred embodiment, the method further includes a step of completing a plurality of high temperature processing steps including a step of formation of the trenched gate and furnishing a body contact implant and activation before the step of metal source silicidation for enabling an employment of the low barrier-height rare earth metal.

Figure 4:
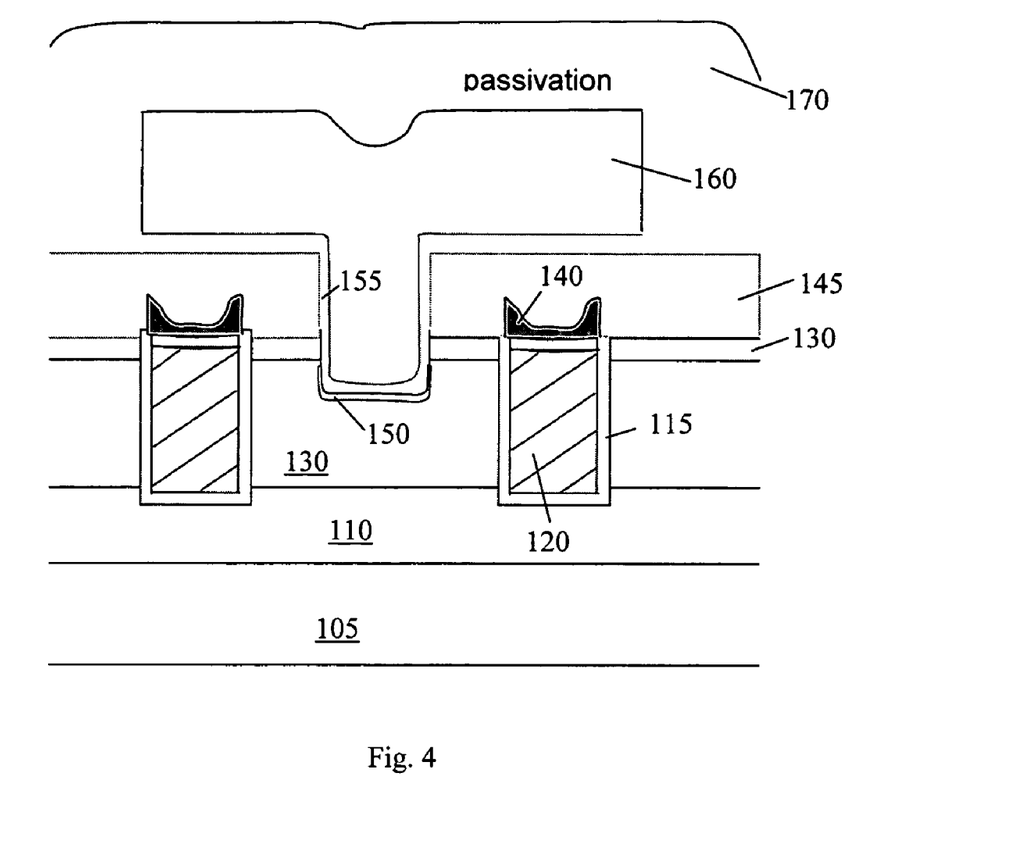
FIG. 4 is a cross sectional view of a trenched DMOS device as another exemplary embodiment of this invention.

FIG. 4 shows a cross sectional view of an alternate preferred embodiment of a DMOS device 100' this invention. The DMOS 100' has a similar device configuration as the DMOS 100 shown in FIG. 2 except that an insulation layer, e.g., a BPSG layer 145 is formed on top of the gate spacer 140 and the silicide source regions 130 to further insulate the gate from the source contact metal 160. Such device has a further advantage to accommodate higher ratings in Vgs of the devices with the better insulation between gate and source metals.

In a preferred embodiment, this invention discloses a trenched semiconductor power device. The trenched semiconductor power device includes a trenched gate insulated by a gate insulation layer and surrounded by a source region encompassed in a body region above a drain region disposed on a bottom surface of a semiconductor substrate. source region surrounding the trenched gate includes a metal of low barrier height in an approximate range of 0.1 to 0.5 eV and preferably between 0.20 to 0.35 eV to function as a Schottky source. In a preferred embodiment, the metal of low barrier height further includes a PtSi layer. In a preferred embodiment, the metal of low barrier height further includes a ErSi layer. In a preferred embodiment, the metal of low barrier height further includes a metal silicide layer having the low barrier height. In a preferred embodiment, the semiconductor power device further includes a top insulation layer disposed under an insulation spacer on top of the trenched gate for insulating the trenched gate from the source region. In a preferred embodiment, the semiconductor power device further includes a top oxide layer disposed under a silicon nitride spacer on top of the trenched gate for insulating the trenched gate from the source region. In a preferred embodiment, the semiconductor power device further includes a source contact disposed in a trench opened into the body region for contacting a body-contact dopant region and covering with a conductive metal layer. In a preferred embodiment, the semiconductor power device further includes a source contact trench opened into the body region for contacting a body-contact dopant region and covering with a Ti/TiN metal layer. In a preferred embodiment, the semiconductor power device further includes a N-channel double diffusion metal oxide semiconductor (DMOS) device. In a preferred embodiment, the semiconductor power device further includes a P-channel DMOS device. In a preferred embodiment, the semiconductor power device further includes an asymmetrical double diffusion metal oxide semiconductor field effect transistor (DMOSFET) device. Its asymmetry arises from the fact that the source of the transistor is an Schottky metal silicide, yet the drain is of a silicon junction.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A trenched semiconductor power device comprising a plurality of trenched gates insulated by a gate insulation layer and surrounded by a source region encompassed in a body region above a drain region disposed on a bottom surface of a semiconductor substrate, further comprising:

a source-body contact trench disposed substantially in a middle portion between two of said trenched gates;

each of said trenched gates is covered on top by a spacer cap with vertical cap edges substantially aligned with gate sidewalls of said trenched gates, and said source region surrounding said trenched gates comprising a metal silicide layer extends between said sidewalls of said trenched gates and a sidewall of a the source-body contact trench; and a low resistance metal layer covering a top surface of said source region comprising said metal silicide layer and also covering the sidewalls and a bottom surface of said source-body contact trench and wherein said source body contact trench is filled with a source contact metal layer directly contacting said low-resistance metal layer whereby said source region comprising said silicide layer contacts said low resistance metal layer on the top surface and on the sidewalls of said source body contact trench.

2. The trenched semiconductor power device of claim 1 wherein:
said source region comprising said metal silicide layer further comprising a PtSi silicide layer.

3. The trenched semiconductor power device of claim 1 wherein:
said source region comprising said metal silicide layer further comprising a ErSi silicide layer.

4. The trenched semiconductor power device of claim 1 wherein:
said source region comprising said metal silicide layer further comprising a metal silicide layer having a thermal stability substantially in a same range as a thermal stability of PtSi silicide and ErSi silicide.

5. The trenched semiconductor power device of claim 1 further comprising:
a top gate insulation layer disposed on top of said trenched gate underneath said spacer cap formed as a concave-shaped insulation spacer for insulating said trenched gate from said source region.

6. The trenched semiconductor power device of claim 1 further comprising:
a top oxide layer disposed on top of said trenched gate underneath said spacer cap formed as a concave-shaped silicon-nitride spacer for insulating said trenched gate from said source region.

7. The trenched semiconductor power device of claim 1 wherein:
said trenched gate is filled with a gate polysilicon up to a level lower than a top surface of a trench of said trenched gate with a top oxide layer filling a top portion of said trenched gate on top of said gate polysilicon with said top oxide layer totally covering said gate polysilicon.

8. The trenched semiconductor power device of claim 1 further comprising:
said low resistance metal layer further comprises a Ti/TiN metal layer covering over the top surface of said source region comprising said metal silicide layer and the sidewalls and the bottom surface of the source-body contact trench.

9. The trenched semiconductor power device of claim 1 wherein:
said semiconductor power device further comprising a N-channel double diffusion metal oxide semiconductor (DMOS) device.

10. The trenched semiconductor power device of claim 1 wherein:
said semiconductor power device further comprising a P-channel DMOS device.

11. The trenched semiconductor power device of claim 1 wherein:
said semiconductor power device further comprising a double diffusion metal oxide semiconductor field effect transistor (DMOSFET) device wherein said source region comprising said metal silicide layer aligned substantially with one of said vertical cap edges of said spacer cap covering on top over said trenched gate; and
said drain region comprising a doped semiconductor region disposed at said bottom surface of said semiconductor substrate opposite vertically from said source region.

12. The trenched semiconductor power device of claim 2 further comprising:
a top gate insulation layer disposed on top of said trenched gate underneath said spacer cap formed as a concave-shaped insulation spacer extends laterally over substantially an entire top surface of the trenched gate for insulating said trenched gate from said source region; and
an insulation layer formed on top of said trenched spacer cap and said source region to further insulate the trenched gate from the source contact metal layer.

13. The trenched semiconductor power device of claim 1 further comprising:
a top gate insulation layer disposed on top of said trenched gate underneath said spacer cap formed as a self-aligned concave-shaped insulation spacer extends laterally over the top gate insulation layer on top of the trenched gate to totally covering said top gate insulation layer for insulating said trenched gate from said source region.

* * * * *